United States Patent
Hatae

(10) Patent No.: US 8,392,485 B2
(45) Date of Patent: Mar. 5, 2013

(54) SIGNAL WAVEFORM GENERATING CIRCUIT AND METHOD

(75) Inventor: Kazuhiko Hatae, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 975 days.

(21) Appl. No.: 12/368,335

(22) Filed: Feb. 10, 2009

(65) Prior Publication Data
US 2009/0295437 A1    Dec. 3, 2009

(30) Foreign Application Priority Data
May 29, 2008    (JP) .................................. 2008-140484

(51) Int. Cl.
H03B 28/00 (2006.01)

(52) U.S. Cl. ........................................... 708/8; 327/129

(58) Field of Classification Search .................. None
See application file for complete search history.

(56) References Cited

U.S. PATENT DOCUMENTS

| | | | | |
|---|---|---|---|---|
| 4,679,480 A | * | 7/1987 | Suzuki | 84/604 |
| 4,843,938 A | * | 7/1989 | Hideo | 84/606 |
| 5,069,105 A | * | 12/1991 | Iba et al. | 84/605 |

FOREIGN PATENT DOCUMENTS

| | | |
|---|---|---|
| JP | 61-69245 A | 4/1986 |
| JP | 1-157604 A | 6/1989 |
| JP | 3-294916 A | 12/1991 |
| JP | 6-188965 A | 7/1994 |
| JP | 8-65054 A | 3/1996 |
| JP | 2003-333179 A | 11/2003 |

OTHER PUBLICATIONS

Japanese Office Action dated Jul. 17, 2012, issued in corresponding Japanese Patent Application No. 2008-140484, w/ English translation.

* cited by examiner

*Primary Examiner* — Ilwoo Park
(74) *Attorney, Agent, or Firm* — Westerman, Hattori, Daniels & Adrian, LLP

(57) ABSTRACT

A signal waveform generating circuit includes a first part storing waveform data of a signal to be generated, a second part storing additional data for adjusting the waveform data, and a third part adjusting the waveform data read from the first part by the additional data read from the second part.

6 Claims, 12 Drawing Sheets

SIGNAL WAVEFORM GENERATING CIRCUIT AND METHOD

CROSS-REFERENCE TO RELATED APPLICATION

This application is based upon and claims the benefit of priority of the prior Japanese Patent Application No. 2008-140484, filed on May 29, 2008, the entire contents of which are incorporated herein by reference.

FIELD

The embodiments described herein relate to a signal waveform generating circuit and a signal waveform generating method. More particularly, the embodiments described herein relate to a circuit and a method for generating a DTMF (Dual Tone Multi Frequency) signal used in, for example, a push-button land-line phone, a mobile phone and a portable phone.

BACKGROUND

A known technique for generating a signal waveform uses a memory and a D/A converter. Waveform data stored are sequentially read from a memory by specifying the address, and are converted into an analog waveform by the D/A converter. For example, a DTMF signal is generated by using two tables in order to generate two frequencies. One of the two table stores waveform data about sine waves of relatively high frequencies, and the other table stores waveform data about sine waves of relatively low frequencies. A counter is incremented at sampling timings, and the count value thus obtained specifies the addresses of the tables. Thus, waveform data are sequentially read from the tables and a resultant DTMF signal is generated. This kind of technique is described in, for example, Japanese Patent Application Publication No. 1-157604.

SUMMARY

A signal waveform generating circuit includes a first part storing waveform data of a signal to be generated, a second part storing additional data for adjusting the waveform data, and a third part adjusting the waveform data read from the first part by the additional data read from the second part.

DESCRIPTION OF EMBODIMENTS

A description will now be given, with reference to FIG. 1, of a signal waveform generating circuit capable of generating the DTMF signal related to the present invention.

Figure 1:
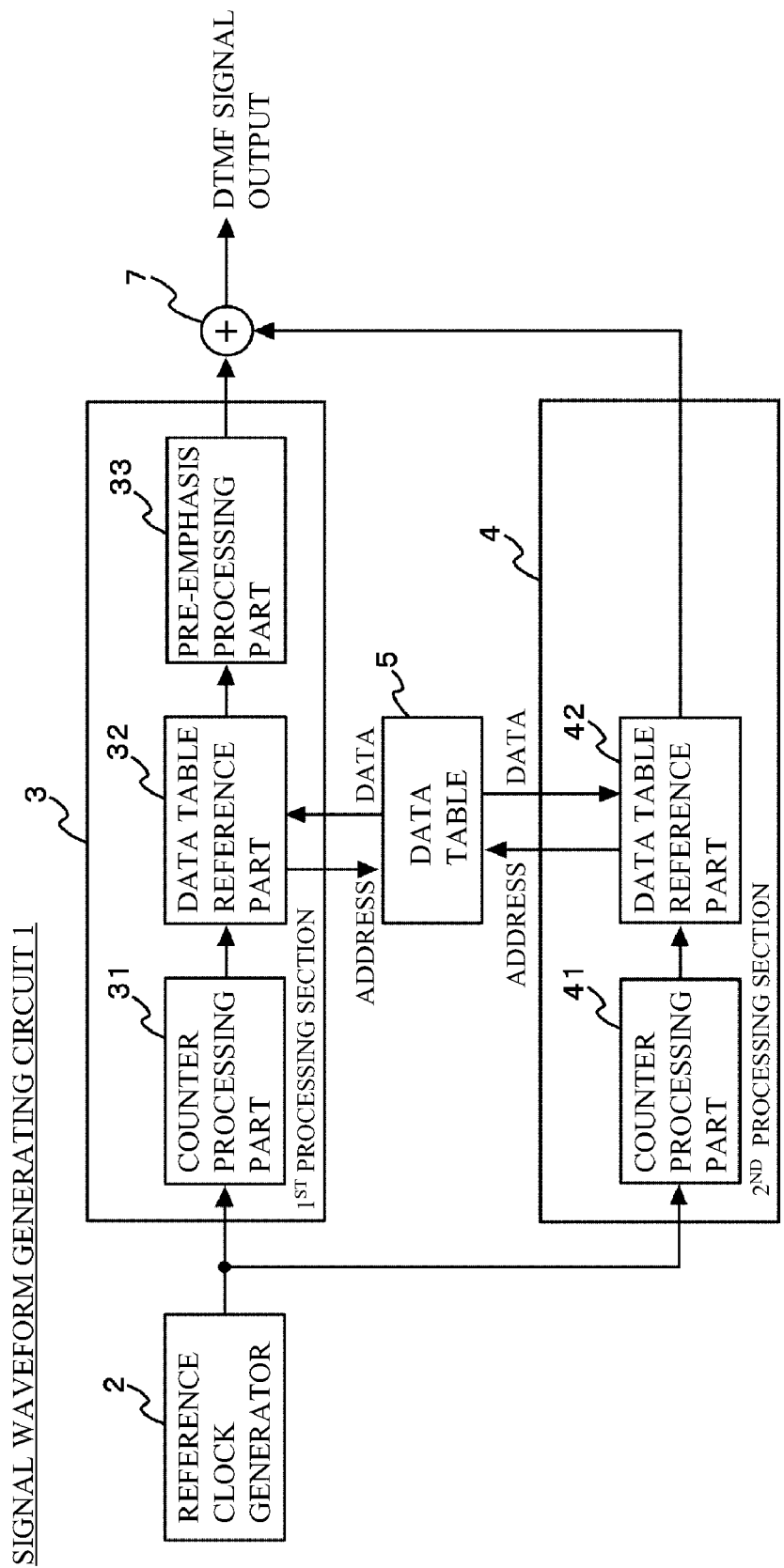
FIG. 1 is a block diagram of a related signal waveform generating circuit.

A signal waveform generating circuit 1 illustrated in FIG. 1 includes a reference clock generator 2, a first processing section 3, a second processing section 4, a table (memory) 5, and an adder 7. The first processing section 3 includes a counter processing part 31, a data table reference part 32, and a pre-emphasis processing part 33. The second processing section 4 includes a counter processing part 41 and a data table reference part 42. The counter processing part 31 and the data table reference part 32 of the first processing section 3 execute a process similar to that executed by the counter processing part 41 and the data table reference part 42 of the second processing section 4. Thus, the following description is primarily directed to the process implemented by the counter processing part 31 and the data table reference part 32.

The reference clock generator 2 generates a reference clock used in the first processing section 3 and the second processing section 4. The reference clock is applied to the counter processing part 31 of the first processing section 3 and the counter processing part 41 of the second processing section 4.

The counter processing part 31 counts the reference clock in accordance with the frequency of a sine wave signal to be generated, and outputs the count value to the data table reference part 32 as a read address for the data table 5. Further, the counter processing part 31 generates a plus/minus decision value for making a decision as to whether waveform data read from the data table 5 forms a waveform of the positive amplitude side or that of the negative amplitude side. The plus/minus decision value is output to the data table reference part 32 together with the read address.

Figure 2:
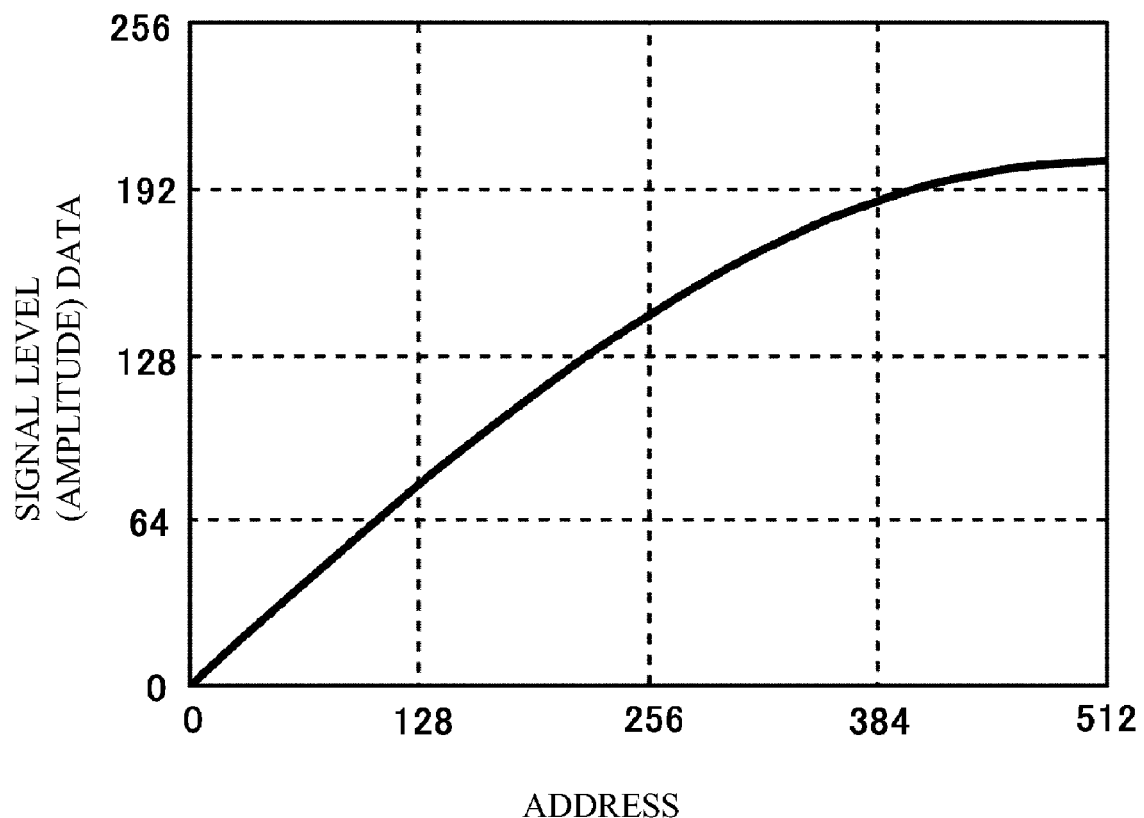
FIG. 2 illustrates a configuration of a data table employed in the circuit illustrated in FIG. 1.

The data table 5 stores waveform data of a sine wave, as illustrated in FIG. 2. The horizontal axis of the graph of FIG. 2 denotes the address of the data table 5, and the vertical axis thereof denotes the signal level (amplitude) of the sine wave signal. The waveform data stored in the data table 5 in the form illustrated in FIG. 2 describes ¼ of the period of the sine wave.

The data table reference part 32 obtains the plus/minus decision value and the read address from the counter processing part 31. The data table reference part 32 accesses the data table 5 by specifying the read address obtained from the counter processing part 31, and obtains the signal level of the sine wave signal from the data table 5. Further, the data table reference part 32 determines the sign of the signal level of the sine wave signal by referring to the plus/minus decision value. Then, the data table reference part 32 sends the sine wave signal thus defined to the pre-emphasis processing part 33.

The pre-emphasis processing part 33 applies the pre-emphasis process to the sine wave signal obtained from the data table reference part 32, so that the signal level of the sine wave signal can be adjusted or corrected. The sine wave signal having the adjusted signal level is applied to the adder 7 from the pre-emphasis processing part 33.

The adder 7 adds the sine wave signal from the first processing section 3 and the sine wave from the second processing section 4, and outputs a resultant DTMF signal. Since the second processing section 4 is not provided with the pre-emphasis processing part 33, the sine wave signal from the second processing section 4 has not been subjected to the pre-emphasis process.

Japanese Patent Application Publication No. 6-188965 discloses that the pre-emphasis process is applied to the sine wave signal. According to this publication, the pre-emphasis process is implemented by an attenuator.

It is desired that the signal waveform generating circuit is compact as much as possible, particularly, when it is provided in portable phones. The recent portable phones have multiple functions, and the downsizing of the signal waveform generating circuit is particularly desired. However, the use of a multiplier or attenuator as described in Japanese Patent Application Publication No. 6-188965 for implementing the pre-emphasis process increases the circuit scale and prevents downsizing.

According to embodiments of the present invention described below, a downsized signal waveform generating circuit is realized.

First Embodiment

Figure 3:
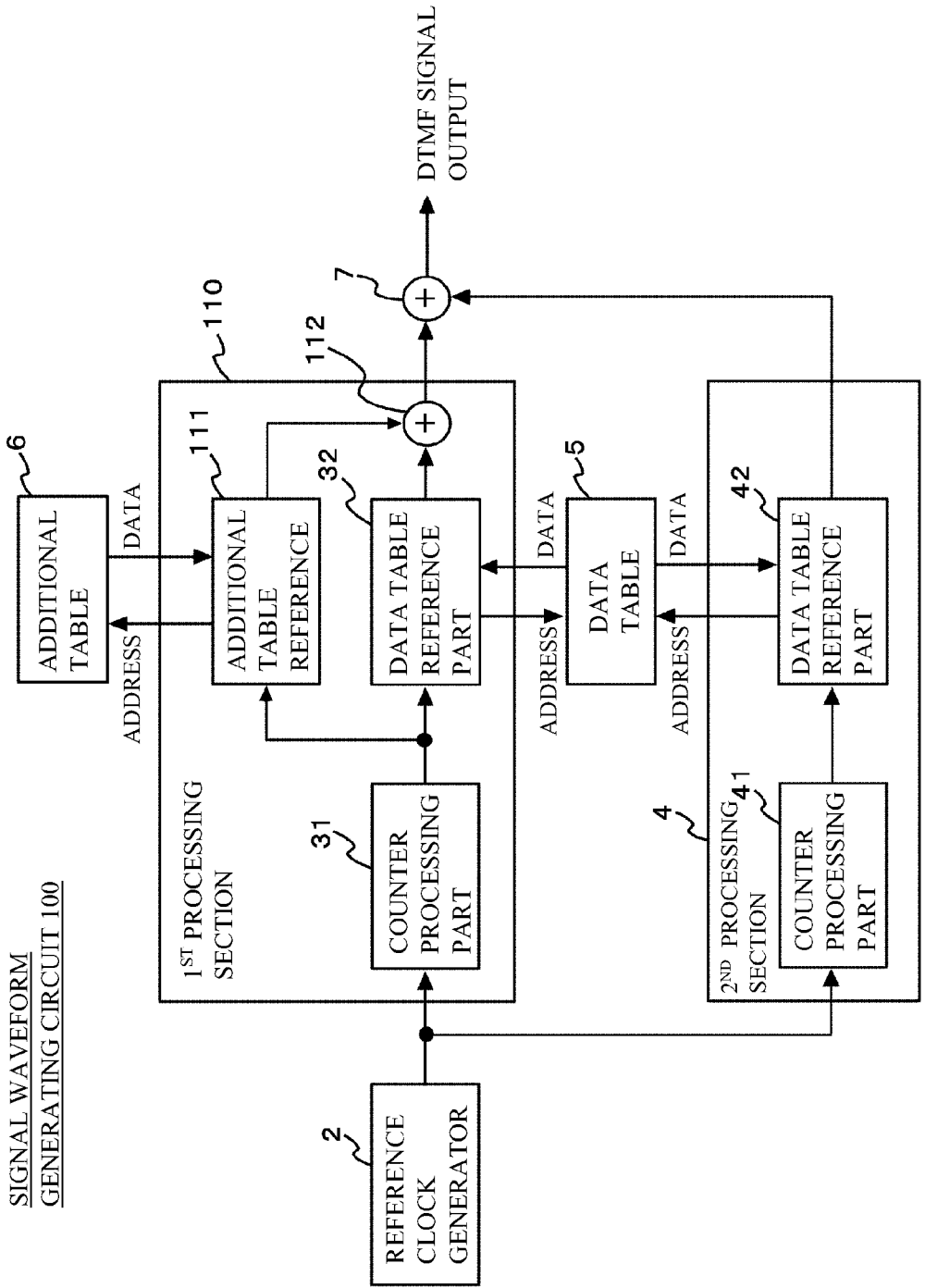
FIG. 3 is a block diagram of an exemplary configuration of a signal waveform generating circuit in accordance with a first embodiment.

FIG. 3 is a block diagram of a signal waveform generating circuit in accordance with a first embodiment of the present invention. In FIG. 3, parts that are the same as those depicted in FIG. 1 are given the same reference numerals and a description thereof is omitted here.

A signal waveform generating circuit 100 illustrated in FIG. 3 has the reference clock generator 2, a first processing section 110, the second processing section 4, the data table 5, an additional table 6 and the adder 7. The data table 5 is defined as a first part and the data table 6 is defined as a second part for the convenience' sake. The first processing section 110 has an additional table reference part 111 and an adder 112 in addition to the counter processing part 31 and the data table reference part 32. The first processing section 110 is defined as a third part for the convenience' sake. The second processing section depicted in FIG. 3 is the same as that depicted in FIG. 1.

The additional table reference part 111 obtains the read address of the additional table 6 from the counter processing part 31. The additional table reference part 111 accesses the additional table 6 with the obtained read address, and reads corresponding additional data therefrom. The read address obtained from the counter processing part 31 by the additional table reference part 111 is the same as the read address obtained from the counter processing part by the data table reference part 32.

Figure 4:
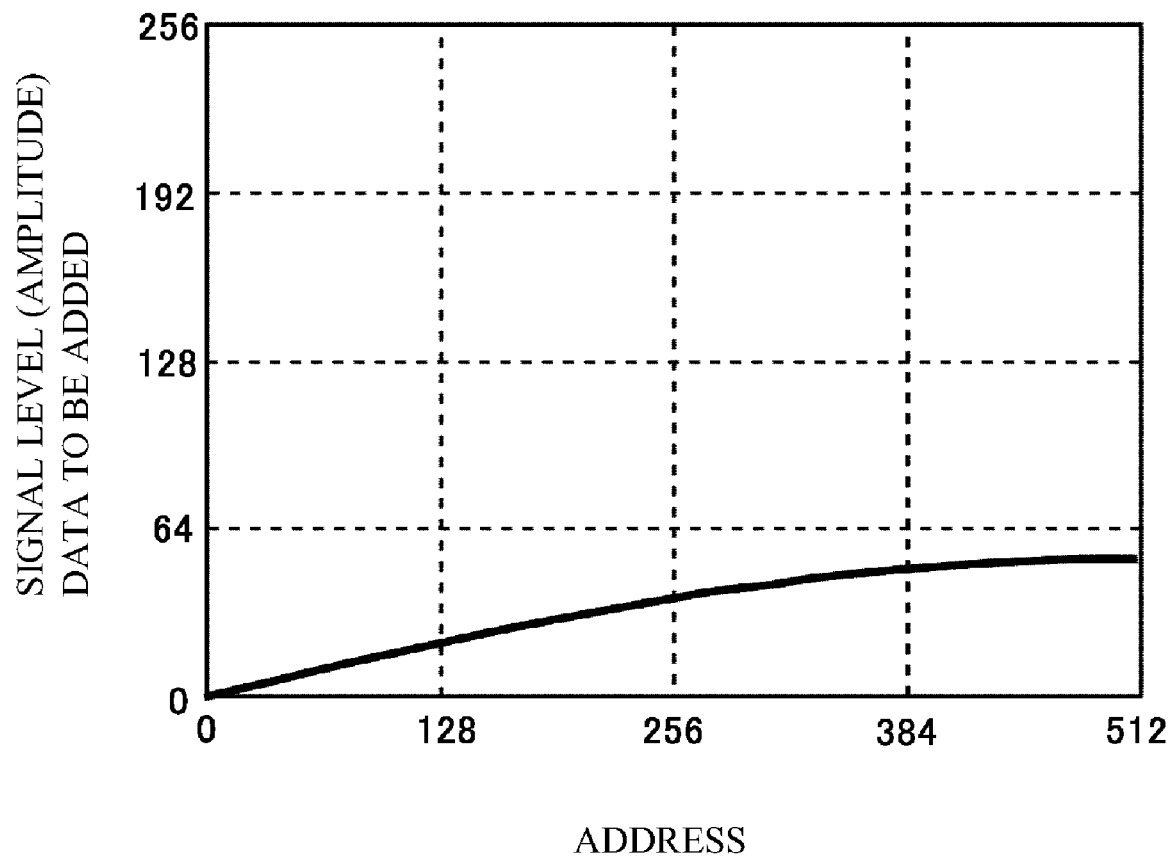
FIG. 4 illustrates a configuration of an additional table employed in the circuit illustrated in FIG. 3.

FIG. 4 illustrates an exemplary content of the additional table 6. The additional table 6 is described in the form of a map or graph in which the horizontal axis is the address of the additional table 6 and the vertical axis is the signal level to be additionally adjusted or corrected by the pre-emphasis process. The additional table 6 depicted in FIG. 4 stores additional data that realizes a pre-emphasis equal to 2 dB with respect to the signal level of the sine wave signal. The additional table reference part 111 reads the additional data and supplies it to the adder 112.

The adder 7 adds the signal level defined by the additional data to the signal level of the sine wave signal read from the data table 5 depicted in FIG. 2 by the data table reference part 32, so that the sine wave signal can be pre-emphasized.

Figure 5:
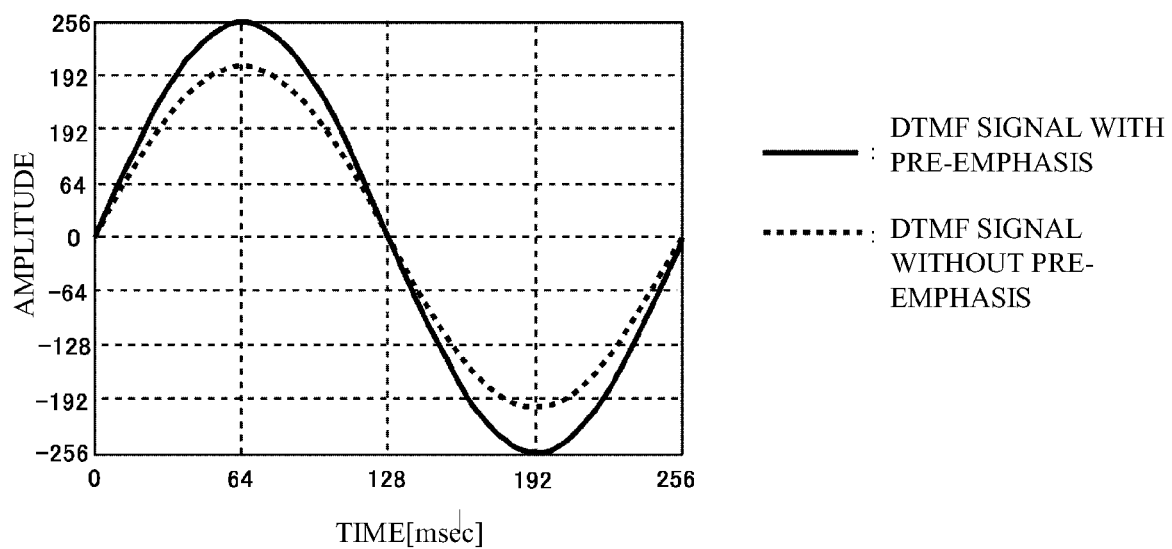
FIG. 5 illustrates a DTMF signal generated by the signal waveform generating circuit of the first embodiment to which a pre-emphasis process has been applied and another DTMF signal without the pre-emphasis process.

FIG. 5 illustrates exemplary waveforms of the DTMF signals that may be output by the adders 7 depicted in FIGS. 1 and 3, in which the horizontal axis denotes the time and the vertical axis denotes the amplitude. A solid line in the graph is a DTMF signal that has been subjected to the pre-emphasis process, and a broken line is another DTMF signal without the pre-emphasis process. Only one cycle of each of the DTMF signals is illustrated in FIG. 5.

According to the present embodiment, the pre-emphasis process is implemented by storing the signal level for realizing the pre-emphasis process in the additional table 6 and adding it to the signal level of the sine wave signal. This structure avoids the use of the multiplier or the like for use in the pre-emphasis process and contributes downsizing of the signal waveform generating circuit 100. Further, circuit design may be simplified because the present embodiment does not employ a complicated circuit configuration resulting from the multiplier or the like.

The above-mentioned embodiment is directed to the pre-emphasis process. Alternatively, the additional data stored in the additional table 6 may be used to realize a de-emphasis process. In this case, the adder 112 functions to subtract the signal level defined by the additional data for the de-emphasis process from the signal level of the sine wave signal.

Second Embodiment

Figure 6:
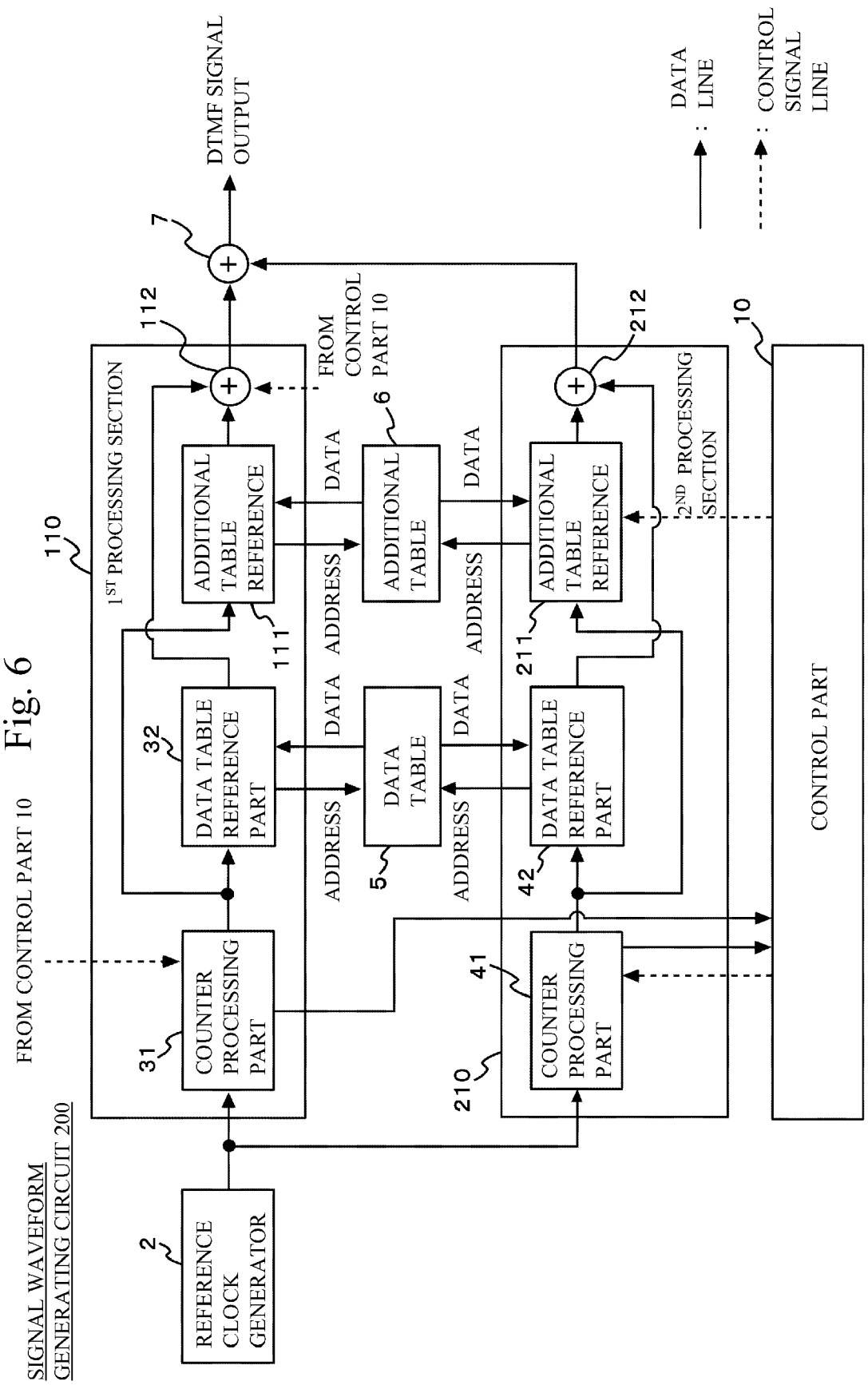
FIG. 6 is a block diagram of an exemplary configuration of a signal waveform generating circuit in accordance with a second embodiment.

FIG. 6 is a block diagram of a signal waveform generating circuit 200 in accordance with a second embodiment of the present invention. In FIG. 6, parts that are the same as those employed in the first embodiment are given the same reference numerals.

As illustrated in FIG. 6, a second processing section 210 is equipped with an additional table reference part 211 and an adder 212 like the first signal processing section 110. Further, the signal waveform generating circuit 200 has a control part 10, which may be implemented by a CPU (Central Processing Unit). The control part 10 obtains the count values of the reference clock and the plus/minus decision values from the counter processing parts 31 and 41, and controls the adder 112 and the additional table reference part 211 on the basis of these values obtained. Further, the control part 10 resets the counter processing parts 31 and 41 when the frequency of the DTMF signal is changed.

Acoustic noise may take place when the frequency of the DTMF signal is changed. In order to suppress the occurrence of such noise, it is preferable that the frequency of the DTMF signal is changed when the level of the DTMF signal is relatively low. In addition, it is preferable that there is no non-linear transition before and after the frequency of the DTMF signal is changed.

The second embodiment is configured taking the above into consideration. More particularly, a de-emphasis process is carried out in order to reduce the signal level before the frequency of the DTMF signal is changed. The first and second processing sections 110 and 210 respectively carry out the de-emphasis process for the signal level of the sine wave signal read from the data table 5. When the de-emphasis process is carried out, the control part 10 controls the adder 112 to switch to the subtraction mode from the addition mode. Further, the control part 10 instructs the additional table reference part 211 to initiate the operation. The adder 112 substrates the signal level described by the additional data read from the additional table 6 from the signal level of the sine wave signal read from the data table 5 depicted in FIG. 2 by the data table reference part 32. Similarly, the adder 212 that is originally set to the subtraction mode subtracts the signal level described by the additional data read from the additional table 6 from the signal level of the sine wave signal read from the data table 5 by the data table reference part 42.

Then, the frequencies of the sine wave signals that are respectively outputs by the first processing sections 110 and 210 are changed. More particularly, the frequency of the DTMF signal is changed so that the control part 10 resets the counter processing parts 31 and 41, and changes counting of the reference clock for the counter processing parts 31 and 41 so as to obtain the respective new frequencies.

Finally, the control part 10 stops the de-emphasis processes in the first and second processing sections 110 and 210. The control part 10 switches the adder 112 to the addition mode from the subtraction mode. Thus, the adder 112 adds the signal level described by the additional data read from the additional table 6 to the signal level of the sine wave signal read from the data table 5 by the data table reference part 32. Further, the control part 10 stops the operation of the additional table reference part 211. Thus, the additional data is no longer output to the adder 212 from the additional table reference part 211. The signal level of the sine wave signal read from the data table 5 by the data table reference part 32 is output to the adder 7 via the adder 212 as it is.

A description will now be given, with respect to a flowchart of FIG. 7, of a first processing sequence of the control part 10. The control part 10 determines whether the counter processing part 31 increments the count value at step S1. When the answer is YES, the count value of the counter processing part 31 is applied to the data table reference part 32, the additional table reference part 111 and the control part 10. Similarly, at step S1, the control part 10 determines whether the counter processing part 41 increments the count value. When the answer is YES, the count value of the counter processing part 41 is applied to the data table reference part 42 and the control part 10.

The data table reference parts 32 and 42 access the data table 5 with the obtained count values being used as the addresses, and obtain the signal levels of the sine wave signals from the data table 5. The additional table reference part 111 accesses the additional table 6 with the obtained count value being used as the address and obtains corresponding additional data therefrom.

At step S2, the control part 10 determines whether it is time to initiate the de-emphasis process by referring to the count values obtained from the counter processing parts 31 and 41. When it is determined that the answer is YES, the control part 10 activates the de-emphasis process at step S3. More particularly, when the control part 10 determines that it is time to initiate the de-emphasis process by referring to the count value of the counter processing part 31, the control part 10 supplies the adder 112 with an instruction signal which switches the adder 112 from the addition mode to the subtraction mode. Further, when the control part 10 refers to the count value of the counter processing part 41 and determines that it is time to initiate the de-emphasis process, the control part 10 instructs the additional table reference part 211 to start the operation. The additional table reference part 211 is thus enabled and reads the count value obtained from the counter processing part 41. Then, the additional table reference part 211 accesses the additional table 6 with the obtained count value being used as the address, and obtains corresponding additional data from the additional table 6. The additional table reference part 211 supplies the additional data thus obtained to the adder 212.

The adders 112 and 212 respectively subtract the signal levels described by the additional data obtained by the additional table reference parts 111 and 211 from the signal levels of the sine wave signals obtained by the data table reference parts 32 and 42. Thus, the sine wave signals are de-emphasized in the first and second processing parts 110 and 210.

At step S4, the control part 10 obtains the count values of the counter processing parts 31 and 41 each time the count values are incremented, and determines whether it is time to allow the frequency to be changed by referring to the count values. When the answer is YES, the control part 10 resets the counters of the counter processing parts 31 and 41 to zero and changes the frequency of the DTMF signal at step S5. For example, the control part 10 sets the new frequencies in a built-in register. The counter processing parts 31 and 41 refer to the register and change counting of the reference clock so as to obtain the respective new frequencies.

The control part 10 obtains the count values from the counter processing parts 31 and 41 each time the counters thereof are incremented, and determines whether the respective de-emphasis processes should be terminated by referring to the obtained count values at step S6. When the answer is YES, the control part 10 terminates the de-emphasis process of the signal waveform generating circuit 200 at step S7. More particularly, the control part 10 switches the adder 112 to the addition mode from the subtraction mode. Further, the control part 10 instructs the additional table reference part 211 to stop supplying the additional data. Thus, the sine wave signal that has been pre-emphasized is output from the first processing section 110, and the sine wave that has not been subjected to the pre-emphasis process is output from the second processing section 210.

Figure 7:
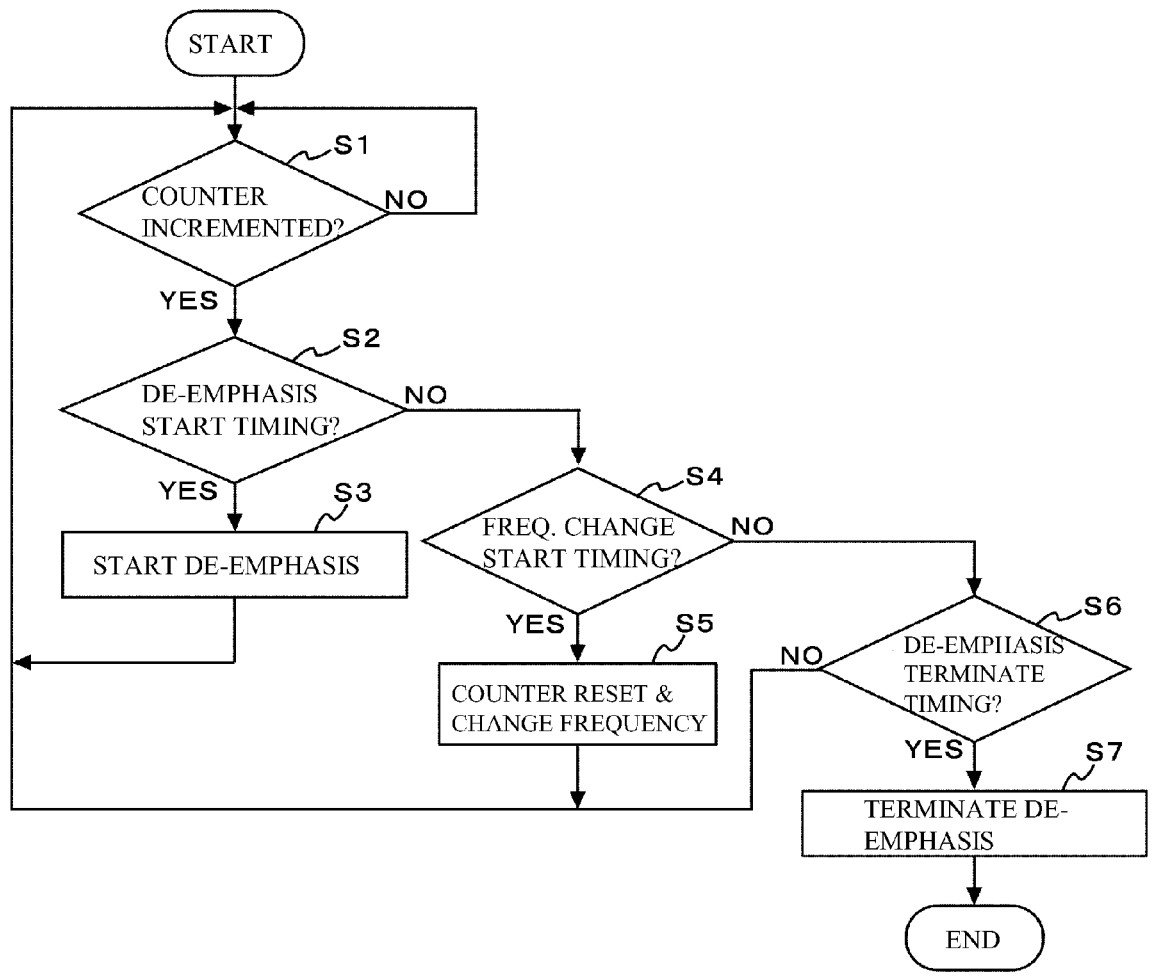
FIG. 7 is a flowchart of a first process sequence of a controller depicted in FIG. 6.
Figure 8:
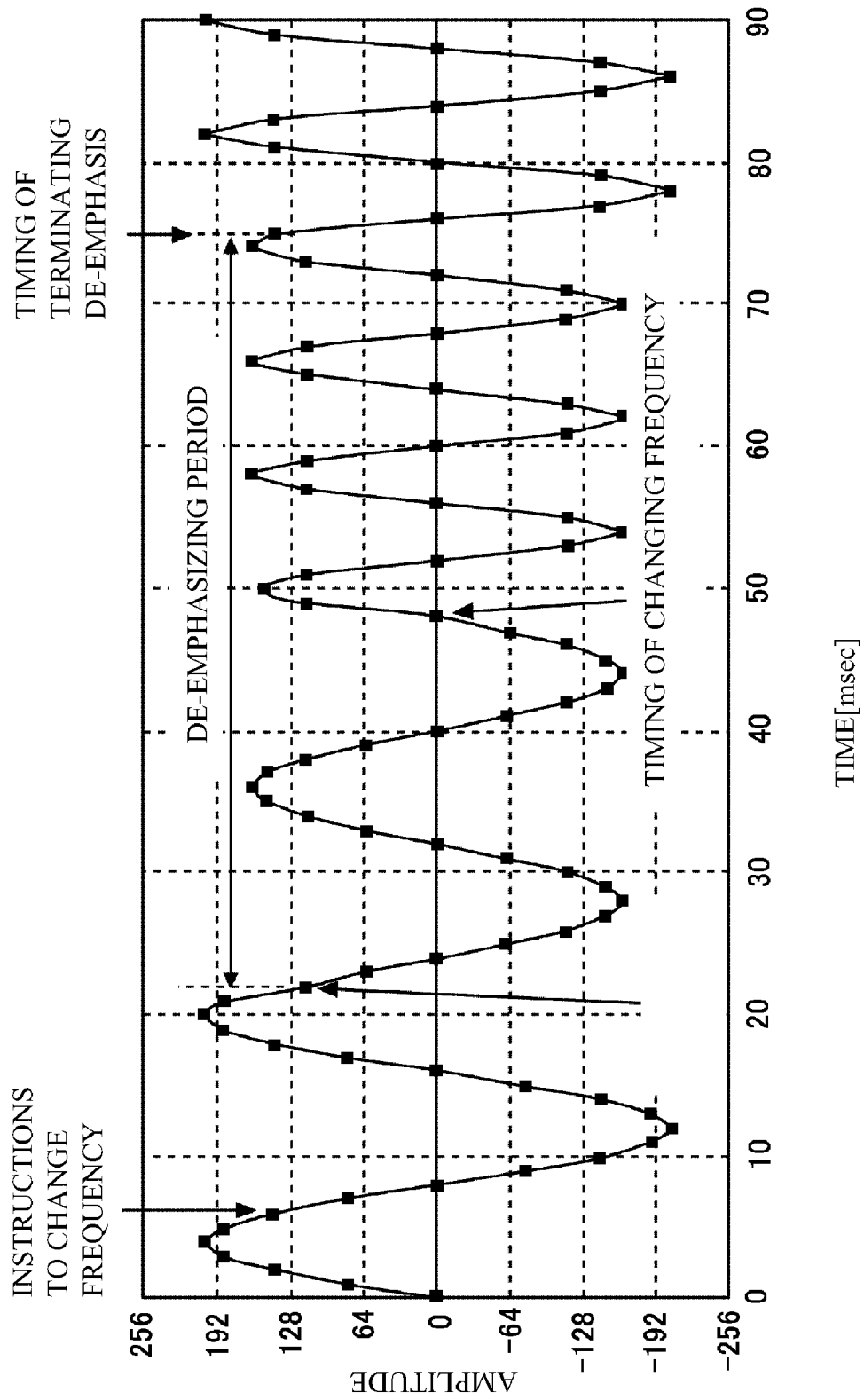
FIG. 8 is a waveform diagram of a DTMF signal generated by the first process sequence.

FIG. 8 illustrates an exemplary waveform the DTMF signal generated by the process sequence depicted in FIG. 7. When a change of frequency is instructed to the control part 10 by an external input signal or the like, the de-emphasis processes are initiated on the basis of the count values of the built-in counters in the counter processing parts 31 and 41. When the count values of the counter processing parts 31 and 41 reach the respective predetermined values from the initial values, the frequency of the DTMF signal is switched. When the count values of the counter processing parts 31 and 41 reach the respective predetermined values from the switching of the frequency of the DTMF signal, the de-emphasis process is terminated.

In the exemplary case depicted in FIG. 8, the count values of the counter processing parts 31 and 41 that count the reference clock are used to determine the timing of change of the DTMF signal frequency and the timings of initialization and termination of the de-emphasis process.

Besides, these timings may be determined by referring to the timings at which the signs of the sine wave signals respectively output by the first and second processing sections 110 and 210 change from positive to negative and vice versa. In this case, the control part 10 obtains the plus/minus decision values from the counter processing parts 31 and 41 and determines zero-crossing of the sine wave signals by checking a change from positive to negative of the plus/minus decision values and vice versa. The control part 10 controls the counter processing parts 31 and 41, the adder 112 and the additional table reference part 211 on the basis of the results of plus/minus decision making.

Figure 9:
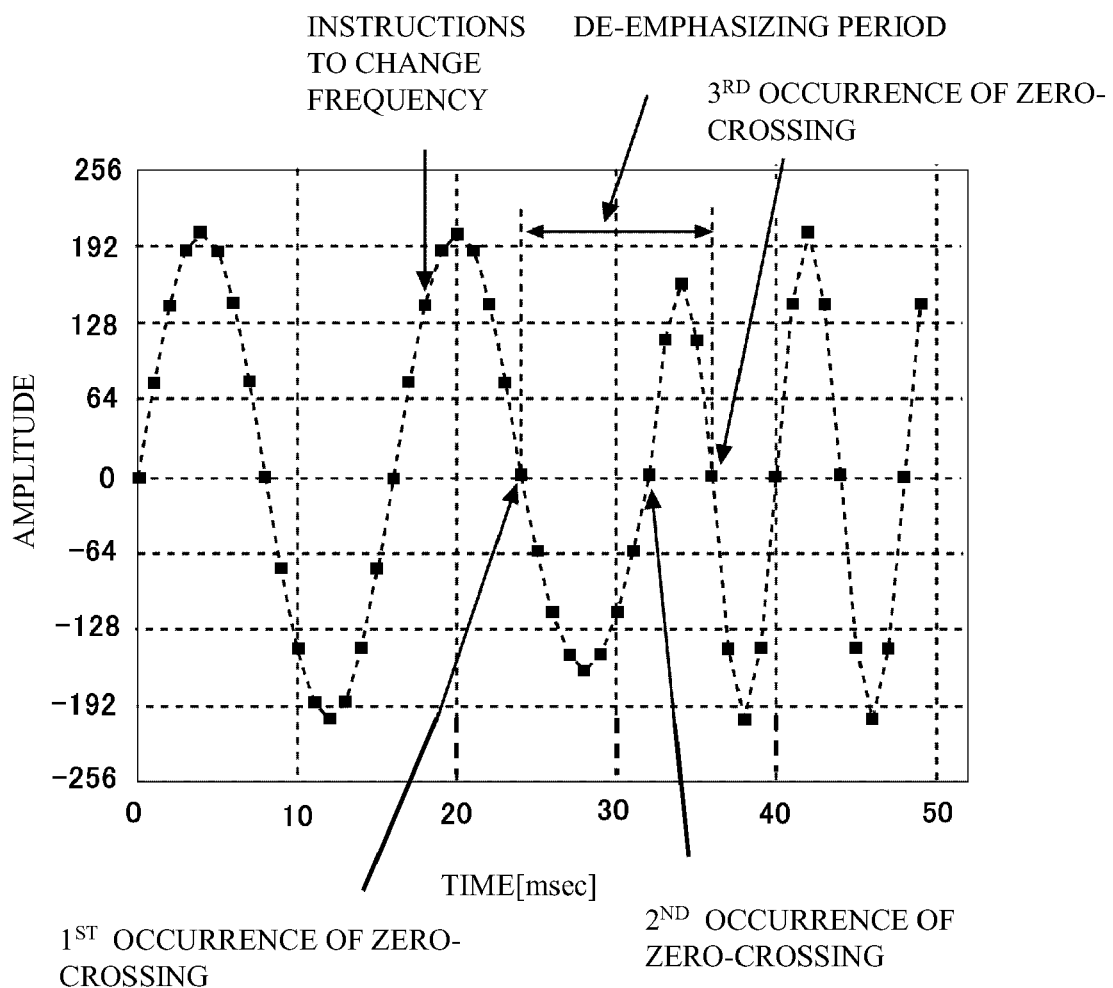
FIG. 9 is a waveform diagram of a DTMF signal generated by a second process sequence.

In an exemplary case depicted in FIG. 9, the de-emphasis processes are started at timings of the first occurrence of zero-crossing of the sine wave signals after a change of frequency is instructed by the external input signal or the like. The counters of the counter processing parts 31 and 41 are reset and the frequency of the DTMF signal is changed at the second occurrence of zero-crossing of the sine wave signals. The de-emphasis processes are terminated and the DTMF signal having the original signal level is output at the timings of the third occurrence of zero-crossing of the sine waves.

Figure 10:
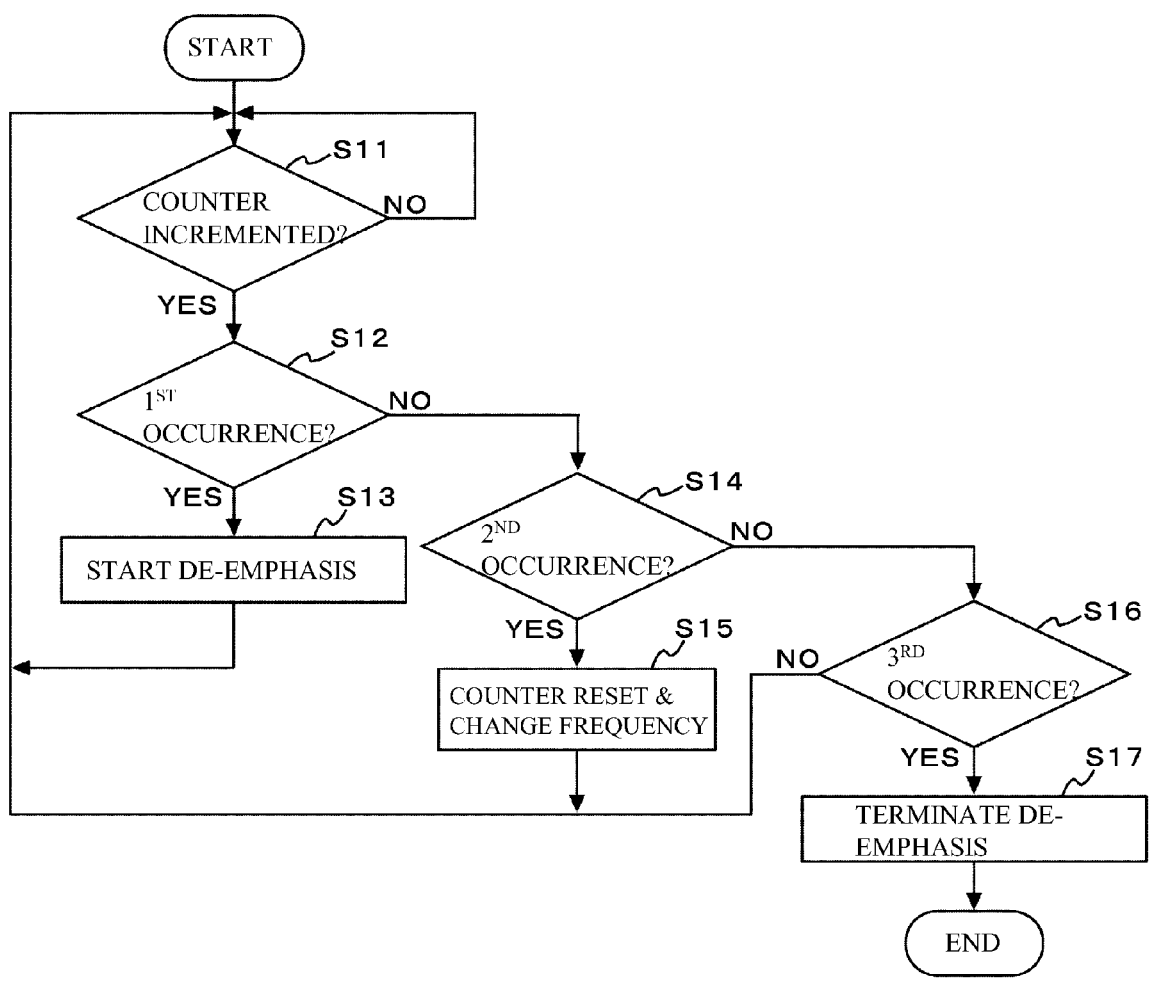
FIG. 10 is a flowchart of a second process sequence of the controller.

FIG. 10 is a flowchart of a second process sequence executed by the control part 10. The sequence illustrated in FIG. 10 utilizes the timings of zero-crossing in order to determine the timing of a change the frequency of the DTMF signal and the timings of initialization and termination of the de-emphasis process.

The control part 10 determines whether the count value of the counter processing part 31 is incremented at step S1. When the result is YES, the count value is applied to the data table reference part 32, the additional table reference part 111 and the control part 10. Similarly, the control part 10 determines whether the count value of the counter processing part 41 is incremented at step S11. When the result is YES, the count value is applied to the data table reference part 42 and the control part 10.

The data table reference parts 32 and 42 access the data table 5 with the respective count values being used as the read addresses, and obtain the signal levels of the sine wave signals of the data table 5. The additional table reference part 111 accesses the additional table 6 with the count value being used as the read address and obtains corresponding additional data therefrom.

The control part 10 obtains the plus/minus decision values from the counter processing parts 31 and 41 in addition to the above-mentioned count values, and makes a decision on zero-crossing on the basis of the plus/minus decision values. The control part 10 receives the signal indicative of a change of frequency and determines whether the first occurrence of zero-crossing takes place in each of the two sine wave signals at step S12. In the first occurrence of zero-crossing, the plus/minus decision values change from positive to negative or vice versa. When the answer of step S12 is YES, the control part 10 starts the de-emphasis process. More particularly, the control part 10 supplies the instruction signal to the adder to change the adder 112 to the subtraction mode from the addition mode, and instructs the additional table reference part 211 to initiate the operation. In response to the instructions by the control part 10, the additional table reference part 211 refers to the additional table 6 with the count value obtained from the counter processing part 41 being used as the address, and obtains the corresponding additional data therefrom. The additional data thus obtained is applied to the adder 212 from the additional table reference part 211.

The adders 112 and 212 subtract the signal levels defined by the additional data respectively obtained by the additional table reference parts 111 and 211 from the signal levels of the sine waves obtained by the data table reference parts 32 and 42.

The control part 10 obtains the plus/minus decision values that are output by the counter processing parts 31 and 41 in addition to the count values, and makes a decision on zero-crossing. The control part 10 determines whether the second occurrence of zero-crossing takes place at step S14. When the answer is YES, the control part 10 determines that it is time to change the frequency of the DTMF signal. Then, the control part 10 resets the counters of the counter processing parts 31 and 41 to zero, and changes the frequency of the DTMF signal at step S15. In this operation, the control part 10 sets the new frequencies in the built-in register. The counter processing parts 31 and 41 change counting of the reference clock so as to obtain the new frequencies set in the register.

The control part 10 obtains the plus/minus decision values that are output from the counter processing parts 31 and 41 together with the count values, and makes a decision on zero-crossing. The control part 10 determines whether the third occurrence of zero-crossing takes place at step S16. When the answer is YES, the control part 10 determines that it is time to terminate the de-emphasis process, and terminates the de-emphasis process at step S17. More particularly, the control part 10 recognizes the timing of termination of the de-emphasis process by using the plus/minus decision value obtained from the counter processing part 31 and changes the adder 112 from the subtraction mode to the addition mode. The control part 10 recognizes the timing of termination of the de-emphasis process by using the plus/minus decision value obtained from the counter processing part 41 and instructs the additional data reference part 211 to stop outputting additional data.

As described above, according to the second embodiment, the signal levels of the sine wave signals are lowered using the additional data in the additional table 6 before the frequency of the DTMF signal is actually changed. It is thus possible to reduce acoustic noise that takes place at the time of changing the frequency of the DTMF signal. The de-emphasis process may be implemented using the additional table used in the first embodiment without any change. This means that another table dedicated to the de-emphasis process is not needed. Thus, the circuit scale can be reduced. Further, it is possible to suppress acoustic noise that takes place at the timings of the respective processes by changing the frequency of the DTMF signal and by initializing and terminating the de-emphasis process.

When the frequency of the DTMF signal is changed, the count values o the counter processing parts 31 and 41 are reset to zero. It is thus possible to suppress a deformation of the DTMF signal that takes place after the frequency is changed. This unique effect will be described in detail with reference to FIGS. 11 and 12.

Figure 11:
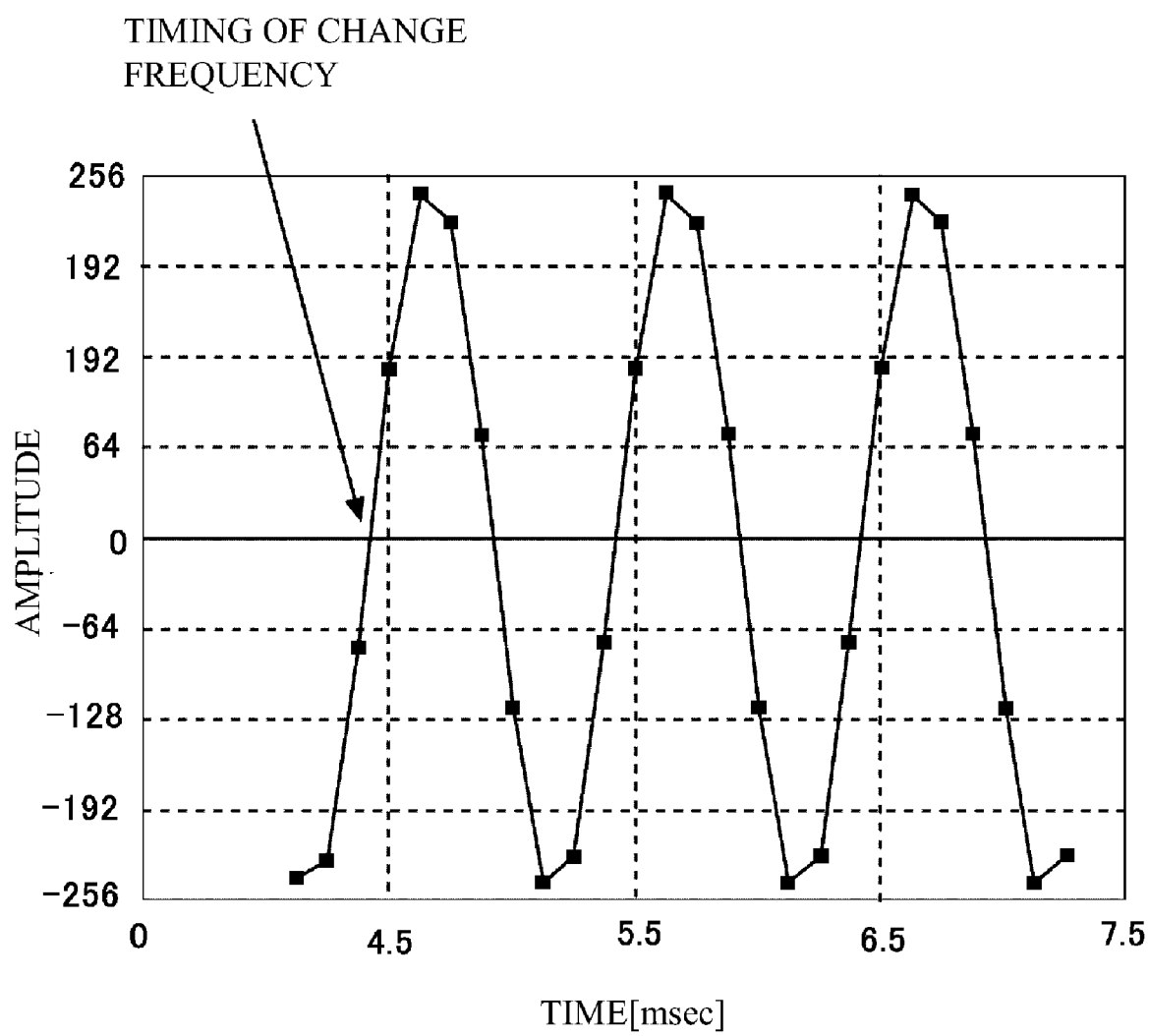
FIG. 11 is a waveform diagram of a DTMF signal obtained when the frequency of the DTMF is changed without resetting a counter in a counter processing part used in the first and second embodiments to zero.
Figure 12:
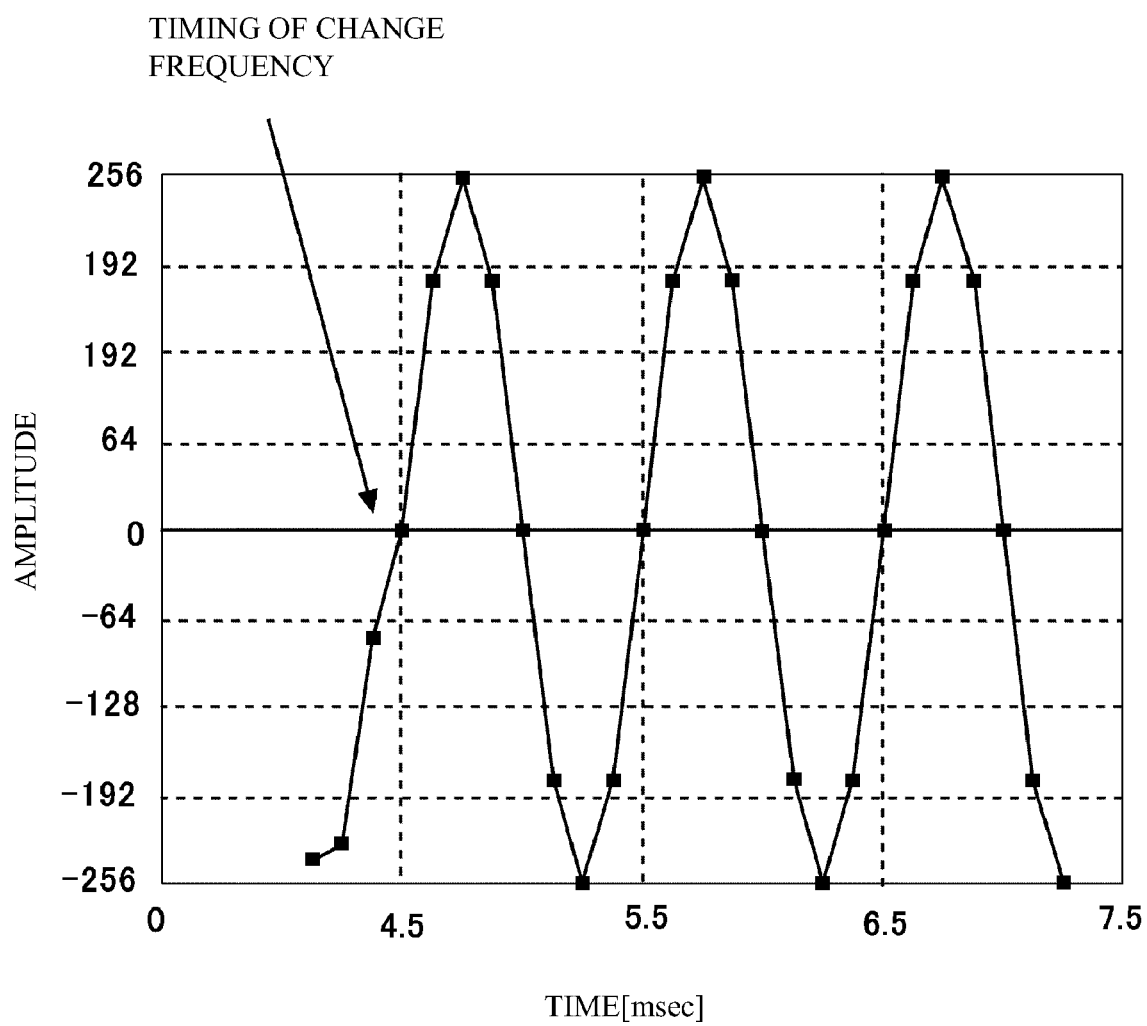
FIG. 12 is a waveform diagram of a DTMF signal obtained when the frequency of the DTMF is changed after the counter in the counter processing part is reset to zero.

FIG. 11 depicts a case where the count values of the counter processing parts 31 and 41 are not reset to zero at the time of changing the frequency of the DTMF signal and the frequency of the DTMF signal is changed with the continuous count values. FIG. 12 depicts a case where the count values of the counter processing parts 31 and 41 are reset to zero (zero-cleared) and the frequency of the DTMF signal is then changed. It is to be noted that the sine wave depicted in FIG. 11 has a waveform that does not reach the peaks of +256 and −256. This means that the sine wave has a great deformation. In contrast, the sine wave depicted in FIG. 12 has a waveform that reaches the peaks and has little deformation.

The present invention is not limited to the specifically described embodiments, but other embodiments and variations may be made without departing from the scope of the present invention.

For example, the signal waveform generating circuits illustrated in FIGS. 3 and 6 may be realized by a dedicated circuit using an ASIC (Application Specific Integrated Circuit) or an FPGA (Field Programmable Gate Array) or software (program) implemented by a CPU or DSP (Digital Signal Processor).

The above-mentioned first and second embodiments employ the data table 5 and the additional table 6 that store waveform data of the sine wave signal equal to only ¼ of the period thereof. The tables 5 and 6 may store waveform data of a cosine wave signal or may store waveform data of the sine or cosine wave signal equal to an arbitrary part of the period thereof.

The above-described second embodiment uses the first, second and third occurrences of zero-crossing in which the de-emphasis process is started in the first occurrence of zero-crossing, and the frequency of the DTMF signal is changed in the second occurrence, the de-emphasis process being terminated in the third occurrence. An arbitrary number of times that zero-crossing is detected may be employed. For example, the de-emphasis process is initiated in the second occurrence of zero-crossing, the frequency of the DTMF signal is changed in the fourth occurrence, and the de-emphasis process is terminated in the sixth occurrence.

The signal waveform generating circuits 100 and 200 illustrated in FIGS. 3 and 6 employ only one additional table 6. Besides, multiple tables that respectively store additional data that define different signal levels to be adjusted may be employed. The additional table reference parts 111 and 211 obtain additional data by referring to additional tables specified by the control part 10.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A signal waveform generating circuit comprising:
   a first part storing waveform data of a signal to be generated;
   a second part storing additional data for adjusting the waveform data; and
   a third part adjusting the waveform data read from the first part by the additional data read from the second part so as to perform a de-emphasis process of the signal to be generated by subtracting a signal level described by the additional data read from the second part from a signal level described by the waveform data of the signal read from the first part before changing a frequency of the signal and carrying out the de-emphasis process at a timing when zero-crossing of the signal level described by the waveform data of the signal occurs.

2. The signal waveform generating circuit according to claim 1, wherein the third part adds or subtracts a signal level described by the additional data read from the second part to or from a signal level described by the waveform data of the signal read from the first part.

3. The signal waveform generating circuit according to claim 1, further comprising a fourth part counting a reference clock to generate a count value describing an address with which the waveform data of the signal and the additional data are respectively read from the first and second parts, wherein the fourth parts clears the count value when the frequency of the signal to be generated is changed.

4. A signal waveform generating method comprising:
   reading waveform data of a signal to be generated from a first part;
   reading additional data for adjusting the waveform data from a second part;
   adjusting the waveform data read by the additional data, adjusting the waveform data including performing a de-emphasis process of the signal to be generated by subtracting the signal level described by the additional data from the signal level described by the waveform data of the signal to be generated before changing a frequency of the signal; and
   executing the de-emphasis process at a timing when zero-crossing of the signal level described by the waveform data of the signal occurs.

5. The signal waveform generating method according to claim 4, adjusting the waveform data includes adding or subtracting a signal level described by the additional data to or from a signal level described by the waveform data of the signal to be generated.

6. The signal waveform generating method according to claim 4, further comprising a counting a reference clock to generate a count value describing an address with which the waveform data of the signal and the additional data are respectively read from the first and second parts, and clearing the count value when changing the frequency of the signal to be generated.

* * * * *